United States Patent
Hung

(10) Patent No.: US 9,408,293 B2
(45) Date of Patent: Aug. 2, 2016

(54) PRINTED CIRCUIT BOARD STRUCTURE

(71) Applicant: Hermes-Epitek Corp., Taipei (TW)

(72) Inventor: Chien-Yao Hung, Hsin-Chu (TW)

(73) Assignee: HERMES-EPITEK CORP., Taipei (TW)

( * ) Notice: Subject to any disclaimer, the term of this patent is extended or adjusted under 35 U.S.C. 154(b) by 0 days.

(21) Appl. No.: 14/717,240

(22) Filed: May 20, 2015

(65) Prior Publication Data

US 2015/0342021 A1    Nov. 26, 2015

(30) Foreign Application Priority Data

May 20, 2014    (TW) .............................. 103117591 A

(51) Int. Cl.
| | |
|---|---|
| *H05K 1/00* | (2006.01) |
| *G01R 31/00* | (2006.01) |
| *G01R 31/20* | (2006.01) |
| *H05K 1/02* | (2006.01) |

(52) U.S. Cl.
CPC ........................................ *H05K 1/02* (2013.01)

(58) Field of Classification Search
CPC ........................................................ H05K 1/02
USPC ............ 174/250; 324/756.01, 756.03, 757.02, 324/757.03
See application file for complete search history.

(56) References Cited

U.S. PATENT DOCUMENTS

| | | | |
|---|---|---|---|
| 2007/0182431 A1* | 8/2007 | Komatsu | G01R 1/07307 324/756.03 |
| 2011/0043239 A1* | 2/2011 | Tomita | G01R 1/0735 324/756.03 |
| 2011/0234251 A1* | 9/2011 | Komatsu | G01R 31/2891 324/756.03 |
| 2013/0187676 A1* | 7/2013 | Washio | G01R 31/2889 324/756.03 |

\* cited by examiner

*Primary Examiner* — Sherman Ng
(74) *Attorney, Agent, or Firm* — Muncy, Geissler, Olds & Lowe, P.C.

(57) ABSTRACT

The invention relates to a printed circuit board structure, which comprises a first body, a second body and a sleeve. The sleeve is arranged between and connected with the first body and the second body so as to generate a differential height between the first body and the second body. Via the differential height are solved the problems of insufficient probe stiffness and poor wafer-sort quality, which is caused by decreasing the probe diameter to adapt to miniaturized chips.

10 Claims, 5 Drawing Sheets

PRINTED CIRCUIT BOARD STRUCTURE

BACKGROUND OF THE INVENTION

1. Field of the Invention

The present invention relates to an IC test device, particularly to an assembling type printed circuit board structure of a probe card.

2. Description of the Prior Art

In semiconductor fabrication, wafer sort is referred to a technology testing the integrated circuit (IC) on a wafer to guarantee that IC can operate normally and learn the yield of products. Normally, an automatic test equipment (ATE) is temporarily electrically connected with IC on a wafer to verify the performance of IC. A probe card is used to transmit signals between ATE and IC.

Refer to FIG. 1A. In a conventional wafer sort, probes 1100A of a probe card 1000 are interposed between and connected with a printed circuit board 2000 and a tested wafer 3000, which are separated from each other by a predefined/fixed probe depth $H_{PD}$. The probe 1100A has a specified diameter-to-length ratio so as to maintain the stiffness of the probe 1100A and favor the connection of the probe 1100A to the printed circuit board 2000 and the wafer 3000. With continuous advancement of semiconductor technology, chips are persistently miniaturized to smaller and smaller size. Therefore, it is necessary to reduce the related dimensions of a probe card for wafer sort. Refer to FIG. 1B. The size and spacing of electrodes in the testing area 2100B in the wafer side of the printed circuit board 2000 in FIG. 1B are smaller than the size and spacing of electrodes in the testing area 2100A in the wafer side of the printed circuit board 2000 in FIG. 1A. Thus, the diameter of the probe 1100A in FIG. 1A must be reduced to the diameter of the probe 1100B in FIG. 1B so as to meet the new situation. In the case that the probe depth $H_{PD}$ and the dimensions of the probe card are unchanged, the diameter-to-length ratio of the probes 1100B must be reduced, which will further reduce the stiffness of the probes 1100B and affect the connection of the probes 1100B to the printed circuit board 2000 and the wafer 3000. Thus, the quality and result of wafer sort is also affected.

SUMMARY OF THE INVENTION

One objective of the present invention is to provide a printed circuit board (PCB) structure, which has a two-stage printed circuit board and various sizes of sleeves for adjusting the distance between the wafer and the specified area of the printed circuit board, whereby to shorten the length of the probes appearing between the wafer and the specified area of the printed circuit board, and whereby to maintain the diameter-to-length ratio of the probes within a specified range, wherefore the problem of insufficient probe stiffness is overcome, and wherefore the printed circuit board structure of the present invention can meet the tendency of dimensional reduction in wafer sort and undertake wafer sort in high efficiency, high adaptability and high precision.

In one embodiment, the printed circuit board structure of the present invention comprises a sleeve, a first body and a second body. The sleeve includes a wall, a first protrusion and a second protrusion. The wall extends along an axial direction, has an outer wall surface and an inner wall surface in a radial direction, and has a first wall end and a second wall end opposite the first wall end in the axial direction. The first protrusion extends outward radially from the first wall end and defines a first outer side and a first inner side opposite the first outer side in the axial direction. The second protrusion extends inward radially from the second wall end and defines a second outer side and a second inner side opposite the second outer side in the axial direction. The first body is detachably connected with the first inner side. The second body is detachably connected with the second inner side. The first inner side and the second inner side define a sleeve inner side height, which is greater than a first body thickness of the first body.

Preferably, the printed circuit board structure of the present invention comprises a wafer. The first body and the wafer define a predefined probe depth. The second body and the wafer define an adjustment depth. The predefined probe depth is greater than the adjustment depth.

In another embodiment, the printed circuit board structure is arranged over a wafer for wafer sort and comprises a sleeve, a first body and a second body. The sleeve includes a wall. The wall extends along an axial direction and has an outer wall surface and an inner wall surface in a radial direction. The first body is disposed in the outer wall surface of the sleeve. The second body is disposed in the inner wall surface of the sleeve. The first body and the wafer define a predefined probe depth. The second body and the wafer define an adjustment depth. The predefined probe depth is greater than the adjustment depth.

Below, embodiments are described in detail in cooperation with the attached drawings to make easily understood the objectives, technical contents, characteristics and accomplishments of the present invention.

DESCRIPTION OF THE PREFERRED EMBODIMENT

Figure 1A:
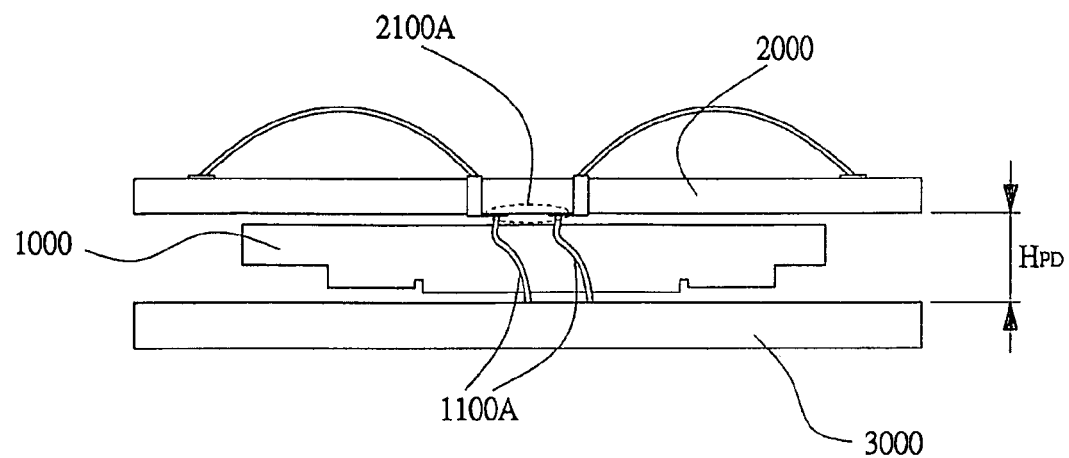
FIG. 1A is a sectional view schematically showing that the probes of a probe card are connected with a printed circuit board and a wafer in a conventional wafer sort.
Figure 1B:
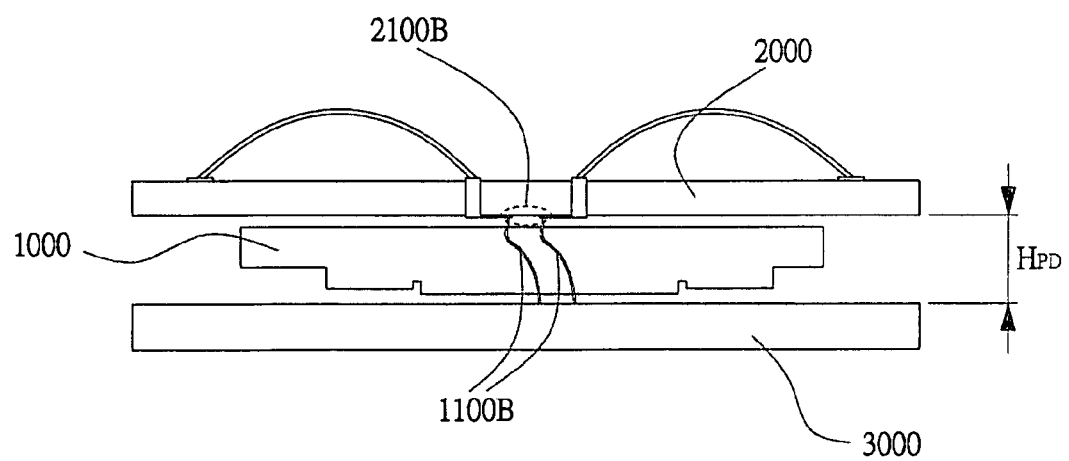
FIG. 1B is a sectional view schematically showing that the probes have a smaller diameter than the probes in FIG. 1A.
Figure 2:
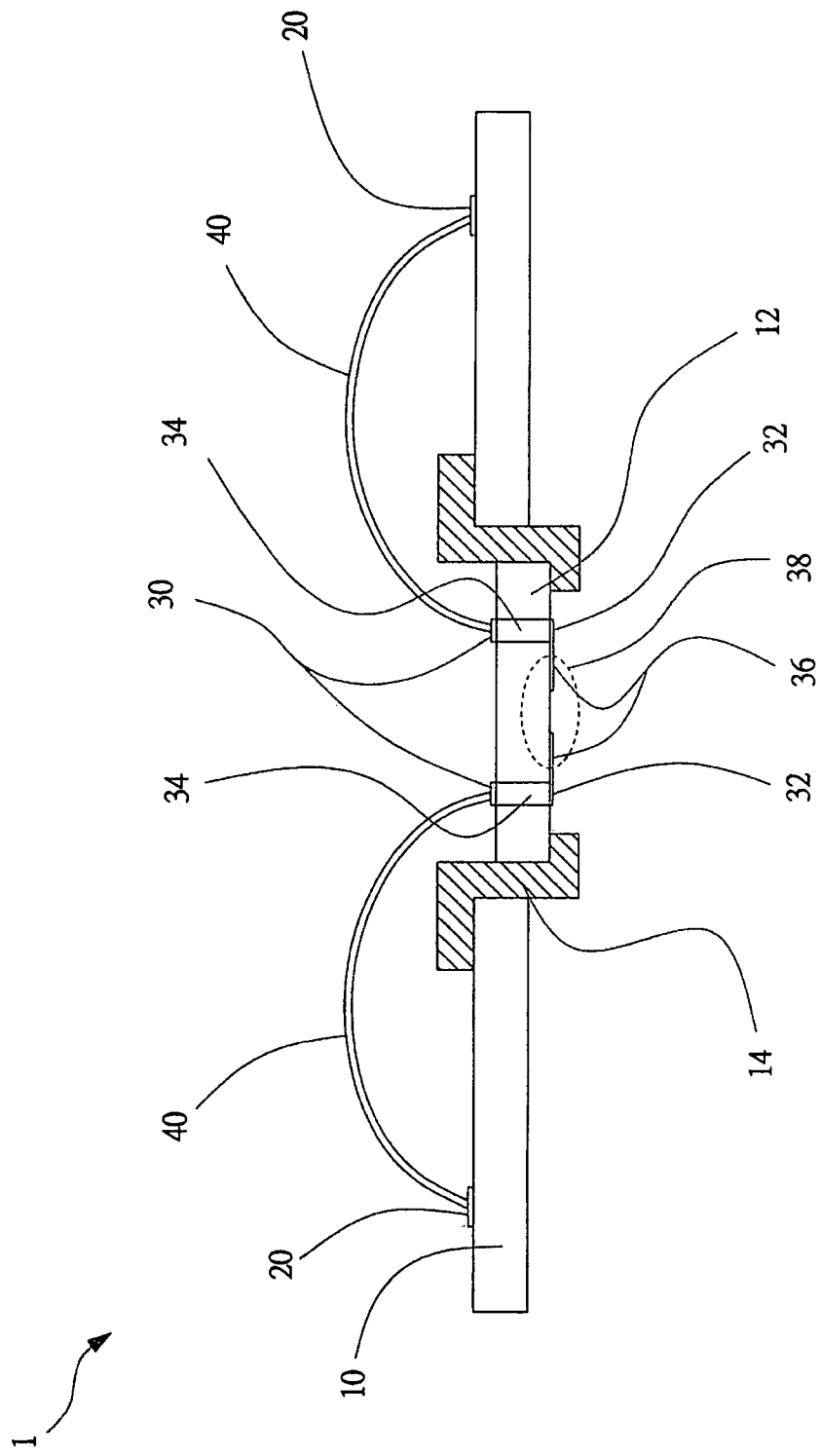
FIG. 2 is a sectional view schematically showing a printed circuit board structure according to one embodiment of the present invention.
Figure 3:
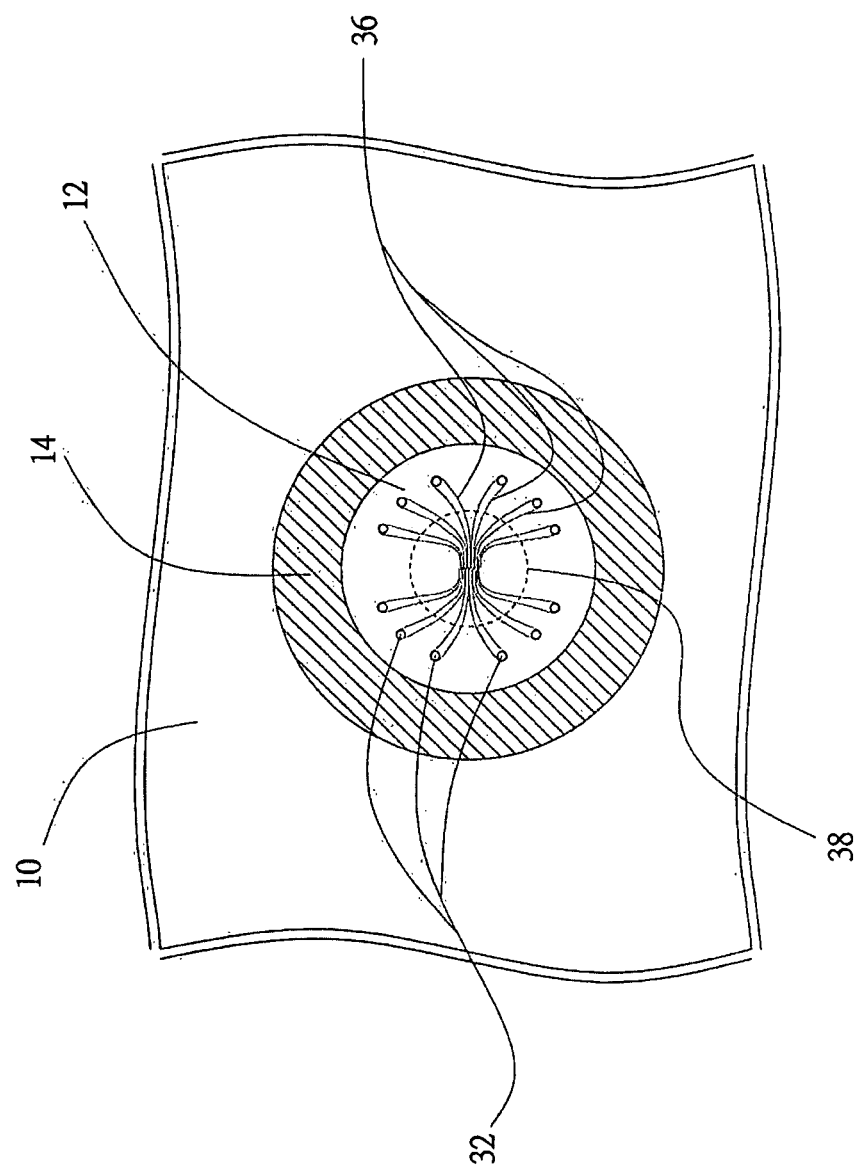
FIG. 3 is a local bottom view schematically showing a printed circuit board structure according to one embodiment of the present invention.

Refer to FIG. 2 a sectional view schematically showing a PCB structure according to one embodiment of the present invention. The PCB structure 1 of the present invention comprises a first body 10, a second body 12 and a sleeve/adapter 14. In substance, the sleeve 14 is a hollow column or hollow disc where a through hole penetrates. The sleeve 14 is disposed between the first body 10 and the second body 12 and separates the first body 10 from the second body 12. In detail, the first body 10 is detachably connected with the outer surface of the sleeve 14 (disposed outside the through hole); the second body 12 is detachably connected with the inner surface of the sleeve 14 (disposed inside the through hole). Preferably, the first body 10 has a plurality of first electrodes 20, and the second body 12 has a plurality of second electrodes 30 respectively corresponding to the first electrodes 20. Preferably, a wire 40 is disposed between each of the first electrodes 20 and the corresponding one of the second electrodes 30, electrically connecting the first electrode 20 with the corresponding second electrode 30. Preferably, each of the second electrodes 30 has a corresponding third electrode 32 disposed on the second body 12. Preferably, a plated through hole 34 is formed between each second electrode 30 and the corresponding third electrode 32, penetrating through the second body 12 and electrically connecting the second electrode 30 and the corresponding third electrode 32. Refer to FIG. 2 again and refer to FIG. 3. Preferably, each of the third electrodes 32 has a signal trace 36; the signal trace 36 gradually shrinks in width and extends to a specified/test area 38 where the signal traces 36 contact probes of a probe card (not shown in the drawing). It should be noted: FIG. 3 is not to limit but only to exemplify the quantities and layout of the third electrodes 32 and the signal traces 36.

In one embodiment, the second body 12 has at least one electric barrier (not shown in the drawing) disposed between each two adjacent signal traces 36, especially among the rear ends of at least two signal traces 36. The electric barrier has a higher insulation coefficient, such as an insulation coefficient equal to or higher than the insulation coefficient of air, so as to reduce the probability of current leakage between two adjacent signal traces 36. Preferably, the electric barrier is in form of at least one of slots, holes and structures made of an insulating material; the slots are through slots or blind slots; the holes are through holes or blind holes; the insulating material has an insulation coefficient higher than the insulation coefficient of air.

Figure 4:
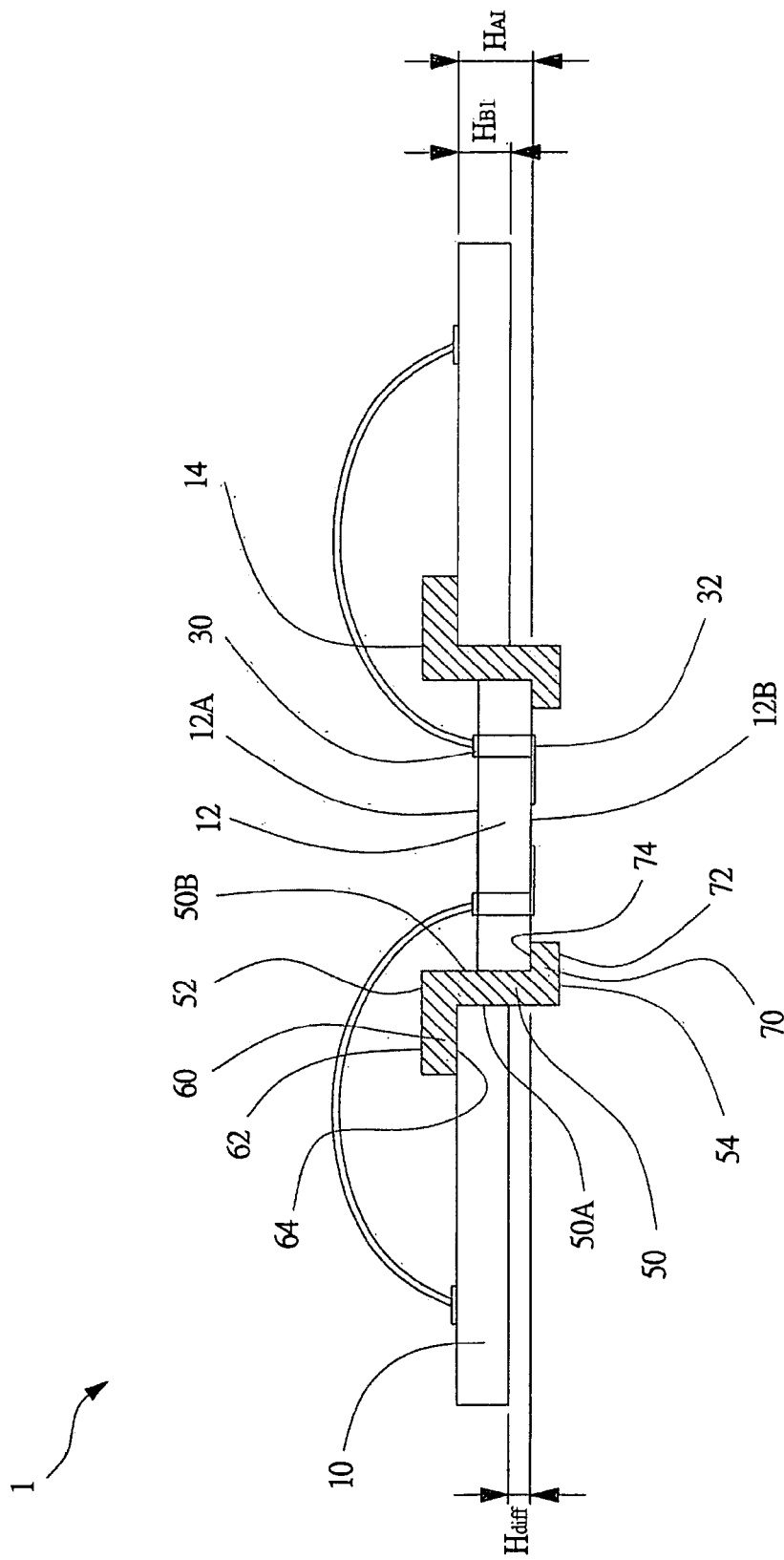
FIG. 4 is a sectional view where numerals are assigned to the components of the sleeve shown in FIG. 2 and characteristic dimensions are defined.

Refer to FIG. 4 for the detailed structure of the sleeve 14. The sleeve 14 includes a wall 50, a first protrusion 60 and a second protrusion 70. The wall 50 extends axially, having an outer wall surface 50A and an inner wall surface 50B in the radial direction and having a first wall end 52 and a second wall end 54 opposite the first wall end 52 in the axial direction. The first protrusion 60 extends outward radially from the first wall end 52 and defines a first outer side 62 and a first inner side 64 opposite the first outer side 62 in the axial direction. The second protrusion 70 extends inward radially from the second wall end 54 and defines a second outer side 72 and a second inner side 74 opposite the second outer side 72 in the axial direction. The first body 10 is disposed in the outer wall surface 50A of the sleeve 14. Preferably, the first body 10 is detachably connected with the first protrusion 60 of the sleeve 14. In one embodiment, the first body 10 is detachably connected with the first inner side 64 of the first protrusion 60 of the sleeve 14. The second body 12 is disposed in the inner wall surface 50B of the sleeve 14. Preferably, the second body 12 is detachably connected with the second protrusion 70 of the sleeve 14. In one embodiment, the second body 12 is detachably connected with the second inner side 74 of the second protrusion 70 of the sleeve 14. The abovementioned structure defines a sleeve inner side height $H_{A1}$ between the first inner side 64 and the second inner side 74, which is greater than the first body thickness $H_{B1}$ of the first body 10. Thus, a differential height $H_{diff}$ exists between the second inner side 74 and one side of the first body 10, which is near the second inner side 74. In other words, the differential height $H_{diff}$ exists between one side of the second body 12, which contacts the second inner side 74, and one side of the first body 10, which is near the second inner side 74. The configuration of the second electrodes 30 and the third electrodes 32 in the second body 12 is further described in detail below. The second electrodes 30 are disposed on one side 12A of the second body 12, which is far away from the second protrusion 70. The third electrodes 32 are disposed on another side 12B of the second body 12, which is near the second protrusion 70, and correspond to the second electrodes 30.

Figure 5:
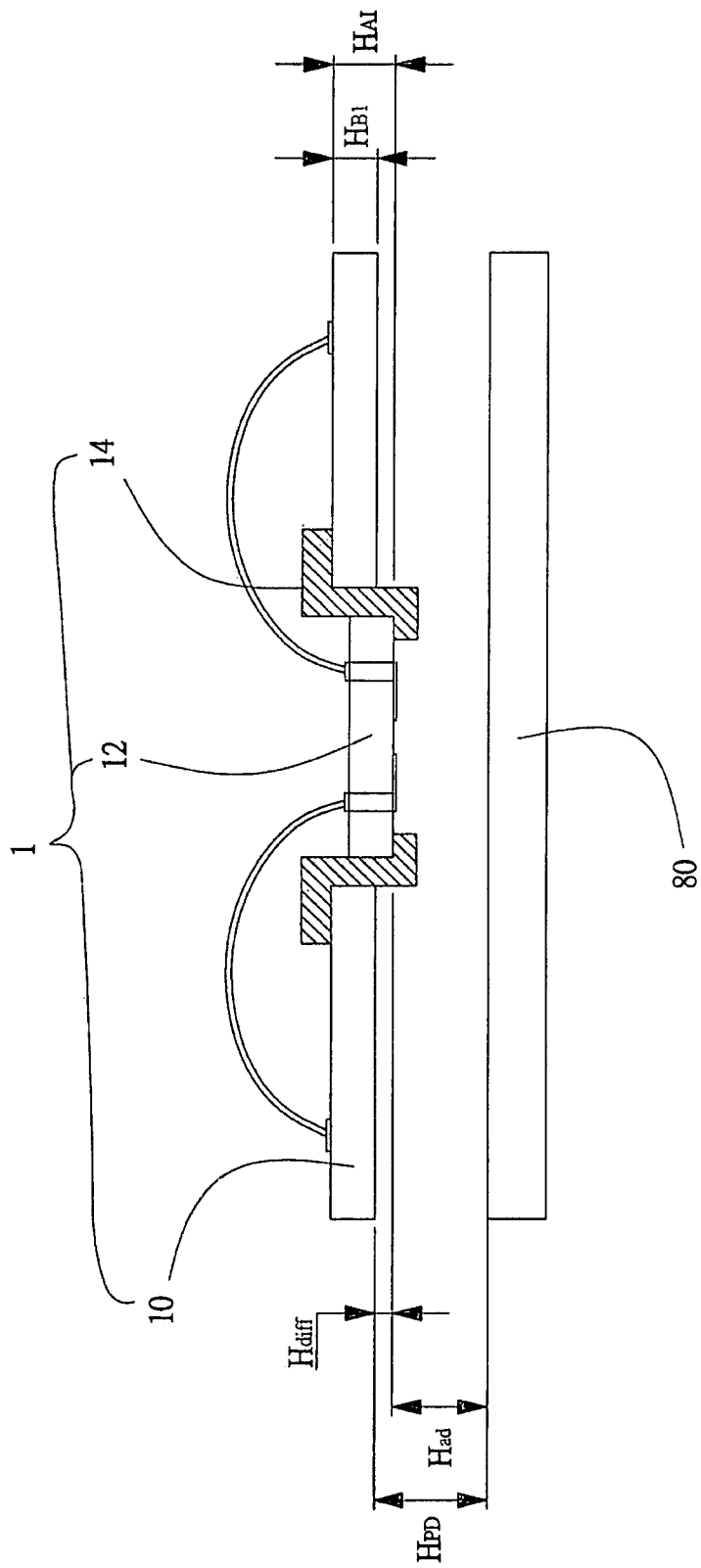
FIG. 5 is a sectional view schematically showing the configuration of a printed circuit board structure and a tested wafer/semiconductor device according to one embodiment of the present invention.

Refer to FIG. 5 a diagram schematically showing the configuration of a PCB structure and a tested wafer/semiconductor device according to one embodiment of the present invention. The PCB structure 1 is disposed over a wafer 80 for wafer sort. The differential height $H_{diff}$ of the sleeve inner side height $H_{A1}$ and the first body thickness $H_{B1}$ makes the adjustment height $H_{ad}$, which is defined by the second body 12 and the wafer 80, smaller than a predefined probe depth $H_{PD}$, which is defined by the first body 10 and the wafer 80. While chip miniaturization demands that the diameter of the probes should be reduced, the distance between the second body 12 and the wafer 80 that are connected by the probes of the probe card (not shown in the drawing), especially the probe length at which the probes connect the second body 12 and the wafer 80, can be reduced without varying the predefined grip length/predefined probe depth $H_{PD}$ between the PCB structure 1 (especially the first body 10) and the wafer 80 because of the abovementioned configuration. Thereby, the diameter-to-length ratio of the probes exposed from the probe card can be maintained within a specified range.

What is claimed is:
1. A printed circuit board structure comprising:
   a sleeve including
      a wall extending along an axial direction, having an outer wall surface and an inner wall surface in a radial direction, and having a first wall end and a second wall end opposite said first wall end in said axial direction;
      a first protrusion extending outward radially from said first wall end and defining a first outer side and a first inner side opposite said first outer side in said axial direction; and
      a second protrusion extending inward radially from said second wall end and defining a second outer side and a second inner side opposite said second outer side in said axial direction;
   a first body detachably connected with said first inner side; and
   a second body detachably connected with said second inner side,
wherein said first inner side and said second inner side define a sleeve inner side height, which is greater than a first body thickness of said first body.
2. The printed circuit board structure according to claim 1, wherein said first body has a plurality of first electrodes; said second body has a plurality of second electrodes respectively corresponding to said first electrodes; and a wire is disposed between each said first electrode and one said second electrode corresponding to said first electrode.
3. The printed circuit board structure according to claim 2, wherein said second electrodes are disposed on one side of said second body, which is far away from said second protrusion; another side of said second body, which is near said second protrusion, has a plurality of third electrodes respectively corresponding to said second electrodes; wherein said second body has a plurality of plated through holes electrically connecting said second electrodes with said third electrodes.
4. The printed circuit board structure according to claim 3, wherein each of said third electrodes has a signal trace extending to a specified area with a width thereof gradually shrinking.

5. The printed circuit board structure according to claim 4, wherein at least one electric barrier is disposed among at least two said signal traces.

6. The printed circuit board structure according to claim 1 further comprising a wafer, wherein said first body and said wafer define a predefined probe depth, and wherein said second body and said wafer define an adjustment depth, and wherein said predefined probe depth is greater than said adjustment depth.

7. A printed circuit board structure arranged over a wafer for wafer sort and comprising
- a sleeve including a wall extending along an axial direction and having an outer wall surface and an inner wall surface in a radial direction;
- a first body disposed in said outer wall surface of said sleeve; and
- a second body disposed in said inner wall surface of said sleeve, wherein said first body and said wafer define a predefined probe depth, and said second body and said wafer define an adjustment depth, and wherein said predefined probe depth is greater than said adjustment depth.

8. The printed circuit board structure according to claim 7, wherein said wall has a first wall end and a second wall end opposite said first wall end in said axial direction; and said wall has a first protrusion extending outward radially from said first wall end and a second protrusion extending inward radially from said second wall end.

9. The printed circuit board structure according to claim 8, wherein said first protrusion of said sleeve detachably rests on said first body, and said second body detachably rests on said second protrusion of said sleeve.

10. The printed circuit board structure according to claim 7, wherein said second body has at least one electric barrier.

* * * * *